United States Patent
Gu et al.

(10) Patent No.: US 11,011,246 B2
(45) Date of Patent: May 18, 2021

(54) SHIFT REGISTER, GATE DRIVING CIRCUIT, DISPLAY DEVICE, AND DRIVING METHOD OF NODE SUSTAINING CIRCUIT

(71) Applicants: HEFEI BOE OPTOELECTRONICS TECHNOLOGY CO., LTD., Hefei (CN); BOE TECHNOLOGY GROUP CO. LTD., Beijing (CN)

(72) Inventors: Honggang Gu, Beijing (CN); Junsheng Chen, Beijing (CN); Kui Gong, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/572,136

(22) Filed: Sep. 16, 2019

(65) Prior Publication Data

US 2020/0303028 A1 Sep. 24, 2020

(30) Foreign Application Priority Data

Mar. 19, 2019 (CN) .......................... 201910209171.8

(51) Int. Cl.
| | | |
|---|---|---|
| G09G 3/36 | (2006.01) | |
| G11C 19/28 | (2006.01) | |
| G11C 11/4074 | (2006.01) | |
| G11C 7/12 | (2006.01) | |
| G11C 7/22 | (2006.01) | |

(52) U.S. Cl.
CPC ............. *G11C 19/28* (2013.01); *G11C 7/12* (2013.01); *G11C 7/222* (2013.01); *G11C 11/4074* (2013.01)

(58) Field of Classification Search
CPC ...... G09G 3/3677; G09G 3/3696; G09G 3/20; G09G 3/2096; G09G 2310/08; G09G 2310/0286; G09G 2300/0809; G09G 2300/0842; G09G 2300/0871; G09G 2300/0426; G09G 2300/0819; G11C 19/28; G11C 7/12
USPC ..................................................... 345/98, 100
See application file for complete search history.

(56) References Cited

U.S. PATENT DOCUMENTS

| | | | | |
|---|---|---|---|---|
| 2016/0372069 | A1* | 12/2016 | Lv ........................ | G09G 3/36 |
| 2017/0221441 | A1* | 8/2017 | Gu ...................... | G09G 3/3677 |
| 2018/0025695 | A1* | 1/2018 | Han ..................... | G09G 3/3677 |
| | | | | 345/213 |
| 2020/0043393 | A1* | 2/2020 | Feng ..................... | G11C 19/28 |
| 2020/0302844 | A1* | 9/2020 | Huang ................... | G09G 3/20 |

* cited by examiner

*Primary Examiner* — Jennifer T Nguyen
(74) *Attorney, Agent, or Firm* — Kinney & Lange, P.A.

(57) ABSTRACT

A shift register, a gate driving circuit, a display device, and a driving method of a node sustaining circuit are disclosed. The shift register includes an input sub-circuit, a reset sub-circuit, an output sub-circuit, a pull-down sub-circuit, a first control sub-circuit, a second control sub-circuit, a first storage sub-circuit, and a node sustaining circuit. The node sustaining circuit is configured to sustain the potential of a node, which is one of a pull-up node or a pull-down node in the shift register.

17 Claims, 7 Drawing Sheets

SHIFT REGISTER, GATE DRIVING CIRCUIT, DISPLAY DEVICE, AND DRIVING METHOD OF NODE SUSTAINING CIRCUIT

CROSS REFERENCE TO RELATED APPLICATION(S)

This application claims the benefit of the Chinese patent application No. 201910209171.8, entitled "Voltage self-sustaining circuit and driving method thereof, shift register, gate driving circuit, and display device," filed on Mar. 19, 2019, which is hereby incorporated herein by reference.

TECHNICAL FIELD

The present disclosure relates to the field of circuit control, and in particular, to a shift register, a gate driving circuit, a display device, and a driving method of a node sustaining circuit.

BACKGROUND

GOA (Gate Driver on Array) is a technology for integrating a gate driving circuit on an array substrate, wherein each stage of the GOA circuit (i.e., a shift register) is connected to a gate line for outputting a gate scan signal to the gate line, so as to implement a progressive scan for a plurality of gate lines in a display panel.

For a shift register of each stage in the GOA circuit, it generally includes a plurality of transistors, capacitors, etc., and controls potentials of a pull-up node (PU) and a pull-down node (PD) by the transistors and the capacitors, so as to output the scan signal during an output phase and stop outputting the scan signal (i.e., outputting an abort signal) during a non-output phase, in order to ensure that the GOA circuit performs the progressive scan.

However, due to the influence of factors such as the electrical coupling existing in the shift registers themselves (e.g. the coupling noise voltage caused by a clock signal), the channel resistances and the off current of the transistors themselves, the potentials of the pull-up node (PU) and the pull-down node (PD) fluctuate, causing the output to be unstable, which in turn can lead to display anomalies.

SUMMARY

Embodiments of the present disclosure provide a shift register comprising: an input sub-circuit connected to a signal input terminal, a first power supply terminal, and a pull-up node; the input sub-circuit is configured to output a voltage of the first power supply terminal to the pull-up node under the control of a voltage of the signal input terminal; a reset sub-circuit connected to the pull-up node, a second power supply terminal, and a reset signal terminal; the reset sub-circuit is configured to output a voltage of the second power supply terminal to the pull-up node under the control of a voltage of the reset signal terminal; an output sub-circuit connected to the pull-up node, a signal output terminal, and a clock signal terminal; the output sub-circuit is configured to output a voltage of the clock signal terminal to the signal output terminal under the control of the voltage of the pull-up node; a pull-down sub-circuit connected to a pull-down node, a second level terminal, and the signal output terminal; the pull-down sub-circuit is configured to output a second level voltage of the second level terminal to the signal output terminal under the control of a voltage of the pull-down node; a first control sub-circuit is connected to the reset signal terminal, the first power supply terminal, and the pull-down node; the first control sub-circuit is configured to output the voltage of the first power supply terminal to the pull-down node under the control of the voltage of the reset signal terminal; a second control sub-circuit is connected to the signal input terminal, the second power supply terminal, and the pull-down node; the second control sub-circuit is configured to output the voltage of the second power supply terminal to the pull-down node under the control of the voltage of the signal input terminal; a first storage sub-circuit is connected to the pull-up node and the signal output terminal; the first storage sub-circuit is configured to sustain the potential of the pull-up node; the first storage sub-circuit is further configured to charge the pull-up node; and a first node sustaining circuit connected to a first node, a first level terminal and the second-level terminal; the first node sustaining circuit is configured to sustain the potential of the first node under the control of a first level voltage of the first level terminal and the second level voltage of the second level terminal, wherein the first node is one of the pull-up node and the pull-down node In some embodiments, the first node sustaining circuit comprises a first sustainment control sub-circuit and a second sustainment control sub-circuit. The first sustainment control sub-circuit is connected to the first node, the first level terminal, the second level terminal, and the second sustainment control sub-circuit, and configured to output the first level voltage of the first level terminal or the second level voltage of the second level terminal to the second sustainment control sub-circuit under the control of the first node. The second sustainment control sub-circuit is connected to the first node, the first level terminal, the second level terminal, and the first sustainment control sub-circuit, and configured to output the first level voltage of the first level terminal or the second level voltage of the second level terminal to the first node under the control of the first sustainment control sub-circuit.

In some embodiments, the first sustainment control sub-circuit comprises a first transistor and a second transistor, wherein an aspect ratio of the second transistor is larger than an aspect ratio of the first transistor; the first transistor has a gate and a first electrode both connected to the first level terminal, and a second electrode connected to the second sustainment control sub-circuit; and the second transistor has a gate connected to the first node, a first electrode connected to the second sustainment control sub-circuit, and a second electrode connected to the second level terminal.

In some embodiments, the second sustainment control sub-circuit comprises a third transistor and a fourth transistor; wherein an aspect ratio of the fourth transistor is larger than an aspect ratio of the third transistor; the third transistor has a gate and a first electrode both connected to the first level terminal, and a second electrode connected to the first node; and the fourth transistor has a gate connected to the first sustainment control sub-circuit, a first electrode connected to the first node, and a second electrode connected to the second level terminal.

In some embodiments, the shift register further includes a second node sustaining circuit connected to a second node, the first level terminal and the second-level terminal; the second node sustaining circuit is configured to sustain the potential of the second node under the control of the first level voltage of the first level terminal and the second level voltage of the second level terminal, wherein the second node is another of the pull-up node and the pull-down node different from the first node.

In some embodiments, the second node sustaining circuit comprises a third sustainment control sub-circuit and a fourth sustainment control sub-circuit. The third sustainment control sub-circuit is connected to the second node, the first level terminal, the second level terminal, and the fourth sustainment control sub-circuit, and configured to output the first level voltage of the first level terminal or the second level voltage of the second level terminal to the fourth sustainment control sub-circuit under the control of the second node. The fourth sustainment control sub-circuit is connected to the second node, the first level terminal, the second level terminal, and the third sustainment control sub-circuit, and configured to output the first level voltage of the first level terminal or the second level voltage of the second level terminal to the second node under the control of the third sustainment control sub-circuit.

In some embodiments, the third sustainment control sub-circuit comprises an eleventh transistor and a twelfth transistor, wherein an aspect ratio of the twelfth transistor is larger than an aspect ratio of the eleventh transistor; the eleventh transistor has a gate and a first electrode both connected to the first level terminal, and a second electrode connected to the fourth sustainment control sub-circuit; and the twelfth transistor has a gate connected to the second node, a first electrode connected to the fourth sustainment control sub-circuit, and a second electrode connected to the second level terminal.

In some embodiments, the fourth sustainment control sub-circuit comprises a thirteenth transistor and a fourteenth transistor; wherein an aspect ratio of the fourteenth transistor is larger than an aspect ratio of the thirteenth transistor; the thirteenth transistor has a gate and a first electrode both connected to the first level terminal, and a second electrode connected to the second node; and the fourteenth transistor has a gate connected to the third sustainment control sub-circuit, a first electrode connected to the second node, and a second electrode connected to the second level terminal.

In some embodiments, the shift register further includes a second storage sub-circuit; the second storage sub-circuit is connected to the pull-down node and the second level terminal; and the second storage sub-circuit is configured to sustain the potential of the pull-down node; and the second storage sub-circuit is further configured to charge the pull-down node.

In some embodiments, the shift register further includes a pull-up initialization sub-circuit and/or an output initialization sub-circuit. The pull-up initialization sub-circuit is connected to the pull-up node, the second level terminal, and an initialization voltage terminal; the pull-up initialization sub-circuit is configured to output the second level voltage of the second level terminal to the pull-up node under the control of a voltage of the initialization voltage terminal. The output initialization sub-circuit is connected to the signal output terminal, the second level terminal, and the initialization voltage terminal; the output initialization sub-circuit is configured to output the second level voltage of the second level terminal to the signal output terminal under the control of the voltage of the initialization voltage terminal.

In some embodiments, the second storage sub-circuit comprises a second capacitor. The second capacitor has a first terminal connected to the pull-down node, and a second terminal connected to the second level terminal.

In some embodiments, the pull-up initialization sub-circuit comprises a nineteenth transistor; the nineteenth transistor has a gate connected to the initialization voltage terminal, a first electrode connected to the second level terminal, and a second electrode connected to the pull-up node. The output initialization sub-circuit comprises a twentieth transistor; the twentieth transistor has a gate connected to the initialization voltage terminal, a first electrode connected to the second level terminal, and a second electrode connected to the signal output terminal.

In some embodiments, the input sub-circuit comprises a fifth transistor; the fifth transistor has a gate connected to the signal input terminal, a first electrode connected to the first power supply terminal, and a second electrode connected to the pull-up node; the reset sub-circuit comprises a sixth transistor; the sixth transistor has a gate connected to the reset signal terminal, a first electrode connected to the second power supply terminal, and a second electrode connected to the pull-up node; the output sub-circuit comprises a seventh transistor; the seventh transistor has a gate connected to the pull-up node, a first electrode connected to the clock signal terminal, and a second electrode connected to the signal output terminal; the pull-down sub-circuit comprises an eighth transistor; the eighth transistor has a gate connected to the pull-down node, a first electrode connected to the second level terminal, and a second electrode connected to the signal output terminal; the first control sub-circuit comprises a ninth transistor; the ninth transistor has a gate connected to the reset signal terminal, a first electrode connected to the first power supply terminal, and a second electrode connected to the pull-down node; the second control sub-circuit comprises a tenth transistor; the tenth transistor has a gate connected to the signal input terminal, a first electrode connected to the second power supply terminal, and a second electrode connected to the pull-down node; and the first storage sub-circuit comprises a first capacitor; the first capacitor has a first terminal connected to the pull-up node, and a second terminal connected to the signal output terminal.

Embodiments of the present disclosure further provide a gate driving circuit comprising at least two stages of cascaded shift registers described above; a signal input terminal of the shift register of the first stage is connected to a start signal terminal; a signal input terminal of a shift register of any stage other than the first stage is connected to a signal output terminal of a shift register in a previous stage; a reset signal terminal of a shift register of any stage other than the last stage is connected to a signal output terminal of a shift register of a next stage; and a reset signal terminal of a shift register of the last stage is either connected to the start signal terminal or set separately.

Furthermore, embodiments of the present invention further provide a display device including the gate driving circuit described above.

Embodiments of the present disclosure further provide a method for driving a node sustaining circuit. The node sustaining circuit comprises a first sustainment control sub-circuit and a second sustainment control sub-circuit; the first sustainment control sub-circuit is connected to a voltage sustaining node, a first level terminal, a second level terminal and the second sustainment control sub-circuit, and configured to output a first level voltage of the first level terminal or a second level voltage of the second level terminal to the second sustainment control sub-circuit under the control of the voltage sustaining node; the second sustainment control sub-circuit is connected to the voltage sustaining node, the first level terminal, the second level terminal, and the first sustainment control sub-circuit, and configured to output the first level voltage of the first level terminal or the second level voltage of the second level terminal to the voltage sustaining node under the control of the first sustainment control sub-circuit so as to sustain the potential of the voltage sustaining node. The driving method comprises: applying a first level voltage to the voltage sustaining node, so as to turn on the first sustainment control sub-circuit and output the second level voltage of the second level terminal to the second sustainment control sub-circuit, thereby turning on the second sustainment control sub-circuit and outputting the first level voltage of the first level terminal to the voltage sustaining node; and/or applying a second level voltage to the voltage sustaining node, so as to turn on the first sustainment control sub-circuit and output the first level voltage of the first level terminal to the second sustainment control sub-circuit, thereby turning on the second sustainment control sub-circuit and outputting the second level voltage of the second level terminal to the voltage sustaining node.

BRIEF DESCRIPTION OF THE DRAWINGS

In order to more clearly illustrate technical solutions in embodiments of the present disclosure or in the related art, the drawings to be used in descriptions of the embodiments or the related art will be briefly described below. It is obvious that the drawings in the following description illustrate only some of the embodiments of the present disclosure. Other drawings may also be obtained by those skilled in the art according to these drawings without any inventive effort.

DETAILED DESCRIPTION

The technical solutions in the embodiments of the present disclosure will be clearly and completely described in the following with reference to the accompanying drawings in the embodiments of the present disclosure. It is obvious that the described embodiments are only a part but not all of the embodiments of the present disclosure. All other embodiments which may be obtained by those skilled in the art based on the described embodiments of the invention without any inventive efforts are also within the protection scope of the present invention.

Technical terms or scientific terms openly used in the embodiments of the present disclosure should have the meanings understood by those skilled in the field to which the present disclosure belongs, unless defined otherwise. Words "first", "second", and the like used in the embodiments of the present disclosure do not indicate any order, quantity, or importance, but are only used to distinguish different components. Words such as "comprise" or "include" and the like means that components or items preceding the word covers components or items listed after the word and the equivalent thereof, without excluding other components or items. Words such as "connecting" or "connected" and the like are not limited to physical or mechanical connections, but may include electrical connections, whether direct or indirect. Words such as "Up", "low", "left", "right", and the like are only used to indicate a relative positional relationship, and, when the absolute position of a described object has changed, the relative positional relationship may also change accordingly.

It will be understood by those skilled in the electrical field that in some control circuits (e.g., a gate driving circuit), the voltage of one or more control nodes (such as a pull-up node and a pull-down node) in the control circuit is switched between a high level and a low level under the control of various signal control terminals (generally including a high-level terminal and a low-level terminal), to ensure the normal output of the circuit. However, due to factors such as the resistance, the leakage, and the electrical coupling in the circuit, the voltages of the control nodes are likely to fluctuate, which may in turn cause an abnormal output of the circuit.

Based on this, an embodiment of the present disclosure provides a node sustaining circuit, which is connected to a voltage sustaining node. a first level terminal and a second level terminal, and configured to sustain the potential of the voltage sustaining node under a first level voltage of the first level terminal and a second level voltage of the second level terminal.

Figure 1:
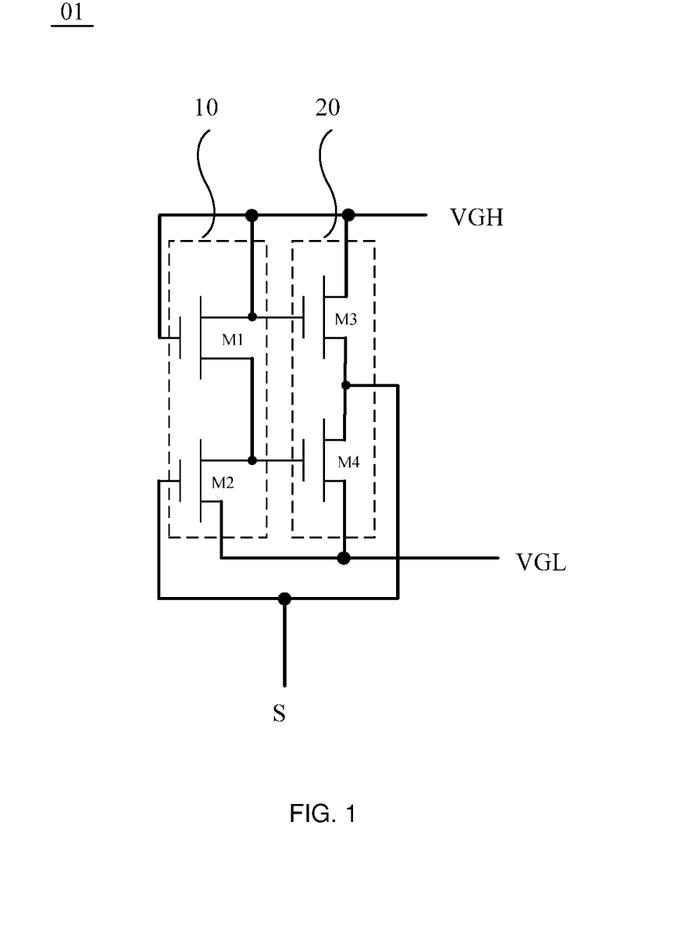
FIG. 1 is a schematic structural diagram of a node sustaining circuit according to an embodiment of the present disclosure.

According to an embodiment, as shown in FIG. 1, the node sustaining circuit 01 includes: a first sustainment control sub-circuit 10 and a second sustainment control sub-circuit 20 which is connected to the first sustainment control sub-circuit 10.

Each of the first sustainment control sub-circuit 10 and the second sustainment control sub-circuit 20 is connected to a voltage sustaining node S, a first level terminal, and a second level terminal. The first level voltage output from the first level terminal may be one of a high level voltage and a low level voltage and the second level voltage output from the second level terminal may be another of the high level voltage and the low level voltage. It is described below by taking the first level terminal being a high level terminal VGH which outputs a high level voltage and the second level terminal being a low level terminal VGL which outputs a low level voltage as an example. Of course the embodiment is also applicable if the first level terminal may be the low level terminal VGL and the second level terminal may be the high level terminal VGH.

The first sustainment control sub-circuit 10 is configured to output a first level voltage of a first level terminal and a second level voltage of a second level terminal to the second sustainment control sub-circuit 20 under the control of the voltage sustaining node. The second sustainment control sub-circuit 20 is configured to output the first level voltage of the first level terminal and the second level voltage of the second level terminal to the voltage sustaining node under the control of the first sustainment control sub-circuit 10.

In an embodiment, the first sustainment control sub-circuit 10 outputs the low level voltage of the low-level terminal VGL to the second sustainment control sub-circuit 20 under the control of a high level voltage of the voltage sustaining node S; the second sustainment control sub-circuit 20 outputs the high level voltage of the high-level terminal VGH to the voltage sustaining node S under the control of a low level voltage from the first sustainment control sub-circuit 10 and the high level voltage of the high-level terminal VGH.

The first sustainment control sub-circuit 10 outputs the high level voltage of the high-level terminal VGH to the second sustainment control sub-circuit 20 under the control of a low level voltage of the voltage sustaining node S and the high level voltage of the high-level terminal VGH; and the second sustainment control sub-circuit 20 outputs the low level voltage of the low-level terminal VGL to the voltage sustaining node S under the control of a high level voltage from the first sustainment control sub-circuit 10.

In summary, if the node sustaining circuit of the present disclosure is connected to a control node in the control circuit through the voltage sustaining node, when the control node is at a high level, the potential of the control node may be sustained to the high level by outputting the high level voltage of the high-level terminal to the voltage sustaining node using the self-sustaining circuit; and when the control node is at a low level, the potential of the control node may be sustained to the low level by outputting the low level voltage of the low-level terminal to the voltage sustaining node using the self-sustaining circuit; thereby ensuring a stable output of the control circuit and avoiding the problem of abnormal output.

The specific circuit structure of the first sustainment control sub-circuit 10 and the second sustainment control sub-circuit 20 mentioned above will be further described below.

In some embodiments, as shown in FIG. 1, the first sustainment control sub-circuit 10 may include a first transistor M1 and a second transistor M2, wherein the aspect ratio of the second transistor M2 is larger than the aspect ratio of the first transistor M1 (that is, the aspect ratio of the channel of the second transistor M2 is larger than the aspect ratio of the channel of the first transistor M1).

The first transistor M1 has a gate and a first electrode connected to the high-level terminal VGH, and a second electrode connected to the second sustainment control sub-circuit 20.

The second transistor M2 has a gate connected to the voltage sustaining node S, a first electrode connected to the second sustainment control sub-circuit 20, and a second electrode connected to the low-level terminal VGL.

In some embodiments, as shown in FIG. 1, the second sustainment control sub-circuit 20 includes a third transistor M3 and a fourth transistor M4; the aspect ratio of the fourth transistor M4 is larger than the aspect ratio of the third transistor M3 (that is, the aspect ratio of the channel of the fourth transistor M4 is larger than the aspect ratio of the channel of the third transistor M3).

The third transistor M3 has a gate and a first electrode both connected to the high-level terminal VGH, and a second electrode connected to the voltage sustaining node S.

The fourth transistor M4 has a gate connected to the first sustainment control sub-circuit 10 (e.g., the second electrode of the first transistor M1, and the first electrode of the second transistor M2), a first electrode connected to the voltage sustaining node S, and a second electrode connected to the low-level terminal VGL.

It should be noted that the transistors in the embodiment of the present disclosure may be enhancement transistors or depletion transistors; the first electrode of any of the above transistors may be the source and the second electrode of the transistor may be the drain, or the first electrode of any of the transistors may be the drain and the second electrode of the transistor may be the source, which will not be limited in the disclosure.

Embodiments of the present disclosure further provide a driving method for a node sustaining circuit as described above, the driving method comprising: applying a high level voltage to the voltage sustaining node S, so as to turn on the first sustainment control sub-circuit 10 and output the low level voltage of the low-level terminal VGL to the second sustainment control sub-circuit 20, thereby turning on the second sustainment control sub-circuit 20 and outputting the high level voltage of the high-level terminal VGL to the voltage sustaining node S.

Or, the driving method comprises applying a low level voltage to the voltage sustaining node S, so as to turn on the first sustainment control sub-circuit 10 and output the high level voltage of the high-level terminal VGH to the second sustainment control sub-circuit 20, thereby turning on the second sustainment control sub-circuit 20 and outputting the low level voltage of the low-level terminal VGL to the voltage sustaining node S.

Particularly, the driving modes of the driving method of the node sustaining circuit 01 are further described below in conjunction with the on/off of the transistors in FIG. 1.

Alternatively, a high level voltage is applied to the voltage sustaining node S, and the second transistor M2 is turned on. Although the first transistor M1 is kept in an on state under the control of the high level voltage of the high-level terminal VGH, the low level voltage of the low-level terminal VGL is output to the gate of the fourth transistor M4 because the aspect ratio of the second transistor M2 is larger than that of the first transistor M1, and thus the fourth transistor M4 is turned off. The third transistor M3 is kept in an on state under the control of the high level voltage of the high-level terminal VGH, thereby outputting the high level voltage of the high-level terminal VGH to the voltage sustaining node S.

Alternatively, a low level voltage is applied to the voltage sustaining node S, and the second transistor M2 is turned off. The first transistor M1 is kept in an on state under the control of the high level voltage of the high-level terminal VGH, thereby outputting the high level voltage of the high-level terminal VGH to the gate of the fourth transistor M4, and the fourth transistor M4 is turned on. Although the third transistor M3 is kept in an on state under the control of the high level voltage of the high-level terminal VGH, the low level voltage of the low-level terminal VGL is output to the voltage sustaining node S because the aspect ratio of the fourth transistor M4 is larger than that of the third transistor M3.

It should be noted that the on/off states of the transistors in the above embodiments are all described by taking N-type transistors as an example. When all transistors are of the P-type, the above states may also apply by only exchanging the high-level terminal VGH and the low-level terminal VGL with each other.

A specific application of the node sustaining circuit 01 in a shift register will be used below as an example to further describe a specific setting of the node sustaining circuit 01.

It can be understood that the shift register controls the potentials of the pull-up node and the pull-down node (a pair of potentials inverted with each other in respect of the high level and the low level) through signal terminals (including a clock signal terminal, an input signal terminal, a reset signal terminal, etc.), in order to achieve the output of the scan signal. However, due to the channel resistance and the off current of the transistor, and the coupling of the clock signal, potential fluctuations on the pull-up node and the pull-down node may easily occur, which in turn adversely affects the display.

Figure 2:
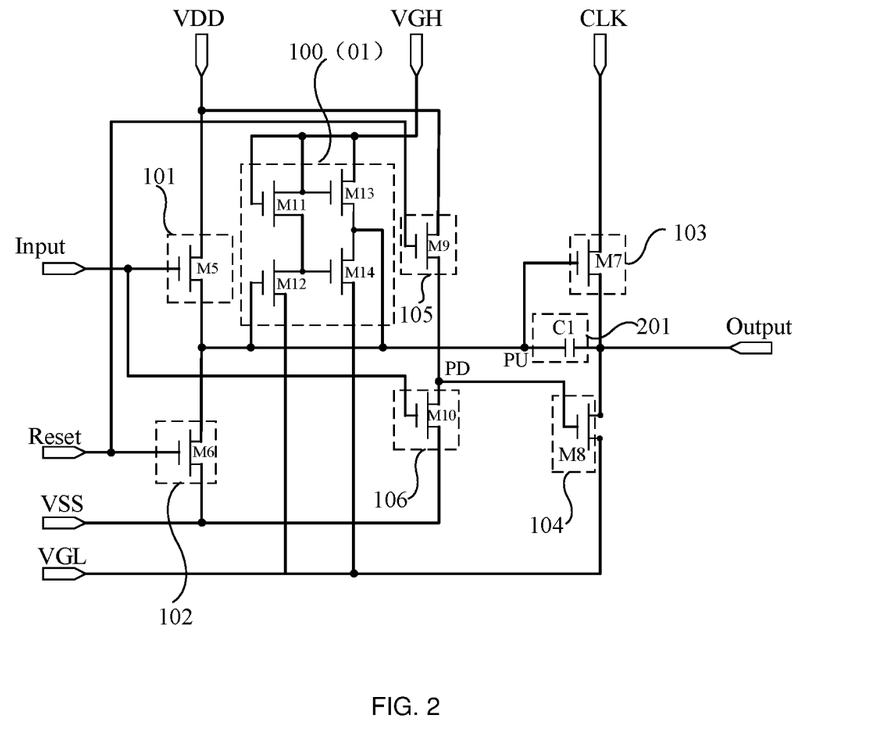
FIG. 2 is a schematic structural diagram of a shift register according to an embodiment of the present disclosure.

In view of this, embodiments of the present disclosure provide a shift register. As shown in FIG. 2, the shift register includes a pull-up sustaining sub-circuit 100. The pull-up sustaining sub-circuit 100 is the foregoing node sustaining circuit 01, wherein the voltage sustaining node S of the pull-up sustaining sub-circuit 100 (the node sustaining circuit 01) is connected to the pull-up node PU to stabilize the potential of the pull-up node PU (including the high potential and the low potential) by the pull-up sustaining sub-circuit 100.

Figure 3:
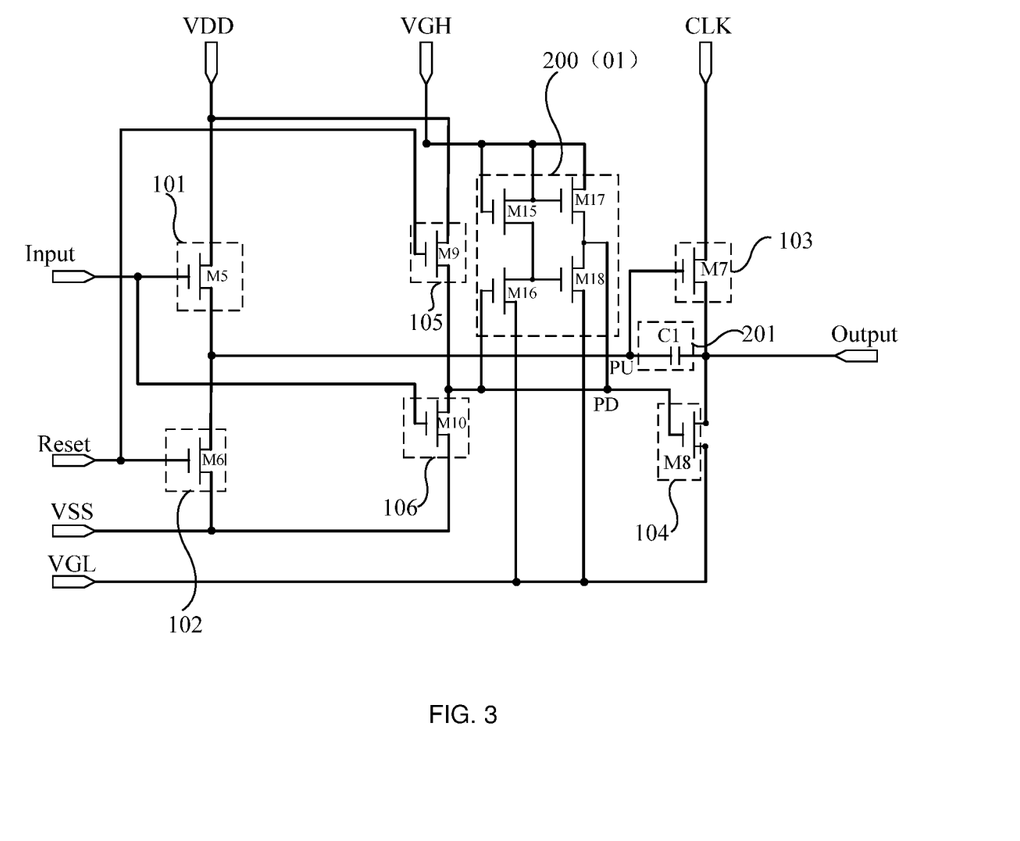
FIG. 3 is a schematic structural diagram of a shift register according to an embodiment of the present disclosure.

Embodiments of the present disclosure further provide a shift register. As shown in FIG. 3, the shift register includes a pull-down sustaining sub-circuit 200. The pull-down sustaining sub-circuit 200 is the foregoing node sustaining circuit 01, wherein the voltage sustaining node S of the pull-down sustaining sub-circuit 200 (the node sustaining circuit 01) is connected to the pull-down node PD to stabilize the potential of the pull-down node PD (including the high potential and the low potential) by the pull-down sustaining sub-circuit 200.

Figure 4:
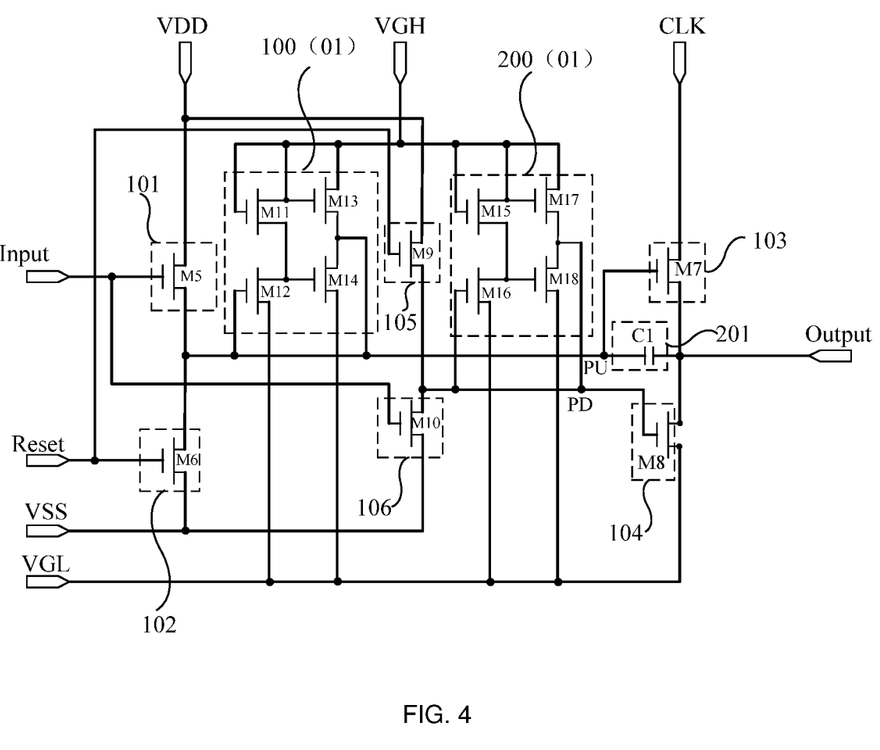
FIG. 4 is a schematic structural diagram of a shift register according to an embodiment of the present disclosure.

Embodiments of the present disclosure further provide a shift register. As shown in FIG. 4, the shift register includes a pull-up sustaining sub-circuit 100 and a pull-down sustaining sub-circuit 200. Each of the pull-up sustaining sub-circuit 100 and the pull-down sustaining sub-circuit 200 is an instance of the aforementioned node sustaining circuit 01, wherein the voltage sustaining node S of the pull-up sustaining sub-circuit 100 (a node sustaining circuit 01) is connected to a pull-up node PU; and the voltage sustaining node S of the pull-down sustaining sub-circuit 200 (a node sustaining circuit 01) is connected to a pull-down node PD, so as to stabilize the potential of the pull-up node PU by the pull-up sustaining sub-circuit 100, and to stabilize the potential of the pull-down node PD by the pull-down sustaining sub-circuit 200.

In addition, those skilled in the art can understand that in some embodiments, since the shift register itself is provided with a high-level terminal VGH and a low-level terminal VGL, for the pull-up sustaining sub-circuit 100 and/or the pull-down sustaining sub-circuit 200 which is an instance of the node sustaining circuit 01, it is not necessary to additionally provide the high-level terminal VGH and the low-level terminal VGL, and the corresponding connections may be directly performed.

It is also understood that the pull-up sustaining sub-circuit 100 in FIGS. 2 and 4 and the pull-down sustaining sub-circuit 200 in FIGS. 3 and 4 are different from the node sustaining circuit 01 of FIG. 1 only in the reference numbers of the transistors. These circuits have the same internal settings and structures. The eleventh transistor M11, the twelfth transistor M12, the thirteenth transistor M13, and the fourteenth transistor M14 in the pull-up sustaining sub-circuit 100 of FIG. 2 and FIG. 4 correspond respectively to the first transistor M1, the second transistor M2, the third transistor M3, and the fourth transistor M4 in the node sustaining circuit 01 of FIG. 1 one by one; and the fifteenth transistor M15, the sixteenth transistor M16, the seventeenth transistor M17 and the eighteenth transistor M18 in the pull-down sustaining sub-circuit 200 of FIG. 3 and FIG. 4 correspond respectively to the first transistor M1, the second transistor M2, the third transistor M3, and the fourth transistor M4 in the node sustaining circuit 01 of FIG. 1 one by one.

In addition, those skilled in the art can understand that a shift register typically further includes other sub-circuits connected to the pull-up node and the pull-down node, such as an input sub-circuit, an output sub-circuit, a reset sub-circuit, a control sub-circuit, and the like. The present disclosure does not specifically limit the specific settings of the other sub-circuits, and in practice, relevant sub-circuits may be designed as needed.

Illustratively, the circuit structure of a specific shift register is provided below. As shown in FIG. 2, FIG. 3 and FIG. 4, the shift register further includes: an input sub-circuit 101, a reset sub-circuit 102, an output sub-circuit 103, a pull-down sub-circuit 104, a first control sub-circuit 105, a second control sub-circuit 106, and a first storage sub-circuit 201.

In some embodiments, the above input sub-circuit 101 is connected to the signal input terminal Input, the first power supply terminal VDD, and the pull-up node PU. The input sub-circuit 101 is configured to output the voltage of the first power supply terminal VDD to the pull-up node PU under the control of the voltage of the signal input terminal Input.

Illustratively, as shown in FIG. 2, FIG. 3, and FIG. 4, the above input sub-circuit 101 may include a fifth transistor M5. The fifth transistor M5 has a gate connected to the signal input terminal Input, a first electrode connected to the first power supply terminal VDD, and a second electrode connected to the pull-up node PU.

In some embodiments, the reset sub-circuit 102 is connected to the pull-up node PU, the second power supply terminal VSS, and the reset signal terminal Reset. The reset sub-circuit 102 is configured to output the voltage of the second power supply terminal VSS to the pull-up node PU under the control of the voltage of the reset signal terminal Reset.

As shown in FIG. 2, FIG. 3 and FIG. 4, the reset sub-circuit 102 may include a sixth transistor M6. The sixth transistor M6 has a gate connected to the reset signal terminal Reset, a first electrode connected to the second power supply terminal VSS, and a second electrode connected to the pull-up node PU.

In some embodiments, the output sub-circuit 103 is connected to the pull-up node PU, the signal output terminal Output, and the clock signal terminal CLK. The output sub-circuit 103 is configured to output the voltage of the clock signal terminal CLK to the signal output terminal Output under the control of the voltage of the pull-up node PU.

Illustratively, as shown in FIG. 2, FIG. 3, and FIG. 4, the output sub-circuit 103 may include a seventh transistor M7. The seventh transistor M7 has a gate connected to the pull-up node PU, a first electrode connected to the clock signal terminal CLK, and a second electrode connected to the signal output terminal Output.

In some embodiments, the pull-down sub-circuit 104 is connected to the pull-down node PD, the low-level terminal VGL, and the signal output terminal Output. The pull-down sub-circuit 104 is configured to output the voltage of the low-level terminal VGL to the signal output terminal Output under the control of the voltage of the pull-down node PD.

As shown in FIG. 2, FIG. 3 and FIG. 4, the pull-down sub-circuit 104 may include an eighth transistor M8. The eighth transistor M8 has a gate connected to the pull-down node, a first electrode connected to the low-level terminal VGL, and a second electrode connected to the signal output terminal Output.

In some embodiments, the first control sub-circuit 105 is connected to the reset signal terminal Reset, the first power supply terminal VDD, and the pull-down node PD. The first control sub-circuit 105 is configured to output the voltage of the first power supply terminal VDD to the pull-down node PD under the control of the voltage of the reset signal terminal Reset.

Illustratively, as shown in FIG. 2, FIG. 3, and FIG. 4, the first control sub-circuit 105 may include a ninth transistor M9. The ninth transistor M9 has a gate connected to the reset signal terminal Reset, a first electrode connected to the first power supply terminal VDD, and a second electrode connected to the pull-down node PD.

In some embodiments, the second control sub-circuit 106 is connected to the signal input terminal Input, the second power supply terminal VSS, and the pull-down node PD. The second control sub-circuit 106 is configured to output the voltage of the second power supply terminal VSS to the pull-down node PD under the control of the voltage of the signal input terminal Input.

As shown in FIG. 2, FIG. 3 and FIG. 4, the second control sub-circuit 106 may include a tenth transistor M10. The tenth transistor M10 has a gate connected to the signal input terminal Input, a first electrode connected to the second power supply terminal VSS, and a second electrode connected to the pull-down node PD.

In some embodiments, the first storage sub-circuit 201 is connected to the pull-up node PU and the signal output terminal Output; the first storage sub-circuit 201 is configured to sustain the potential of the pull-up node PU; the first storage sub-circuit 201 is further configured to charge the pull-up node PU.

As shown in FIG. 2, FIG. 3 and FIG. 4, the first storage sub-circuit 201 may include a first capacitor C1. The first capacitor C1 has a first terminal connected to the pull-up node PU, and a second terminal connected to the signal output terminal Output.

It should be noted that, for the first power supply terminal VDD and the second power supply terminal VSS, in some embodiments, the first power supply terminal VDD and the high-level terminal VGH are the same voltage terminal, and the second power supply terminal VSS and the low-level terminal VGL are the same voltage terminal. In some other embodiments, as shown in FIG. 2, FIG. 3 and FIG. 4, the first power supply terminal VDD and the second power supply terminal VSS are independently set voltage terminals.

It can be understood that, when the first power supply terminal VDD and the second power supply terminal VSS are independently set voltage terminals as shown in FIG. 2, FIG. 3 and FIG. 4, the gate driving circuit formed by cascading these shift registers can realize both a forward scanning and a reverse scanning (that is, a bidirectional scanning can be realized). Illustratively, the first power supply terminal VDD can be set as a high level terminal, and the second power supply terminal VSS can be set as a low level terminal, in order to perform the forward scanning; or, the first power supply terminal VDD can be set as a low level terminal, and the second power supply terminal VSS can be set as a high level terminal, in order to perform the reverse scanning.

Figure 5:
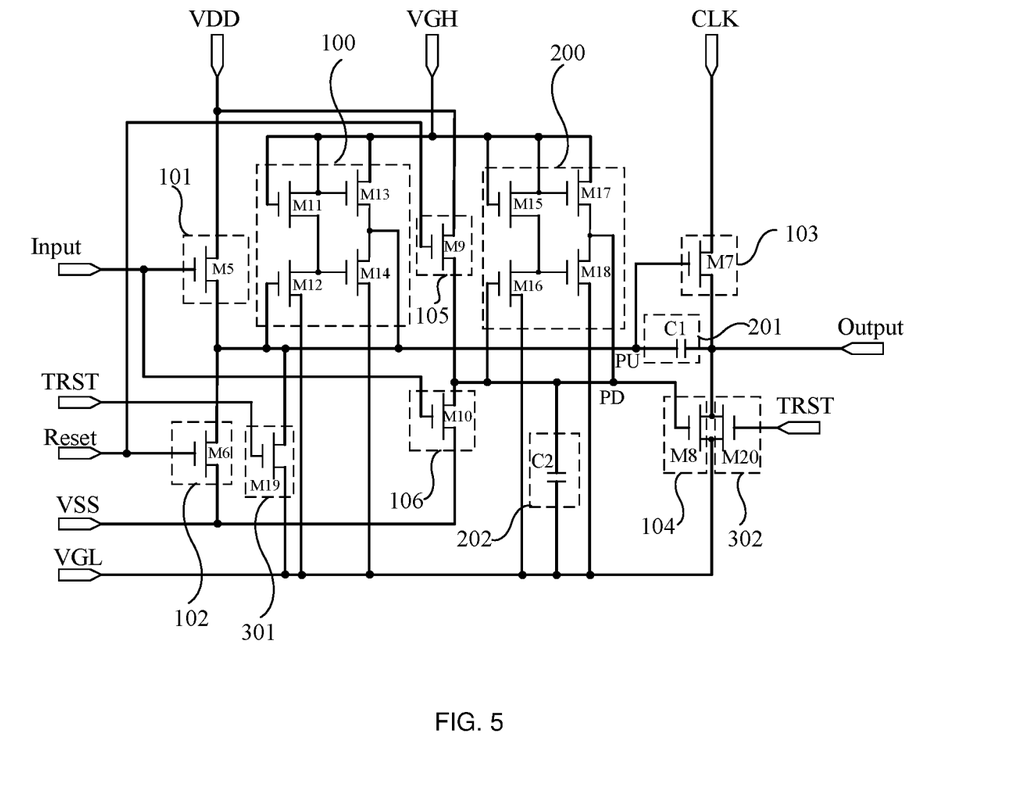
FIG. 5 is a schematic structural diagram of a shift register according to an embodiment of the present disclosure.

On the basis of this, in order to further ensure the stability of the potential of the pull-down node PD while reducing the power consumption, as shown in FIG. 5, the shift register further includes a second storage sub-circuit 202. The second storage sub-circuit 202 is connected to the pull-down node PD and the low-level terminal VGL, and is configured to sustain the potential of the pull-down node PD. The second storage sub-circuit 202 is further configured to charge the pull-down node PD.

Specifically, in some embodiments, as shown in FIG. 5, the second storage sub-circuit 202 may include a second capacitor C2. The second capacitor C2 has a first terminal connected to the pull-down node PD, and a second terminal connected to the low-level terminal VGL; thereby stabilizing the potential of the pull-down node PD by the second capacitor C2, and meanwhile reducing the power consumption.

In addition, at the beginning of a display frame, the pull-up node PU and/or the signal output terminal Output are initialized to enhance the output stability of the shift register.

In some embodiments, as shown in FIG. 5, the shift register may include a pull-up initialization sub-circuit 301 and/or an output initialization sub-circuit 302. FIG. 5 is described by taking the shift register including the pull-up initialization sub-circuit 301 and the output initialization sub-circuit 302 as an example. Of course, in some embodiments, the shift register may include only the pull-up initialization sub-circuit 301, while in some other embodiments, the shift register may include only the output initialization sub-circuit 302.

Specifically, the pull-up initialization sub-circuit 301 is connected to the pull-up node PU, the low-level terminal VGL, and the initialization voltage terminal TRST. The pull-up initialization sub-circuit 301 is configured to output the low level voltage of the low-level terminal VGL to the pull-up node PU under the control of the voltage of the initialization voltage terminal TRST so as to initialize the pull-up node PU.

As shown in FIG. 5, the pull-up initialization sub-circuit 301 may include a nineteenth transistor M19. The nineteenth transistor M19 has a gate connected to the initialization voltage terminal TRST, a first electrode connected to the low-level terminal VGL, and a second electrode connected to the pull-up node PU.

The output initialization sub-circuit 302 is connected to the signal output terminal Output, the low-level terminal VGL, and the initialization voltage terminal TRST. The output initialization sub-circuit 302 is configured to output the low level voltage of the low-level terminal VGL to the signal output terminal Output under the control of the voltage of the initialization voltage terminal TRST so as to initialize the signal output terminal Output.

Illustratively, as shown in FIG. 5, the output initialization sub-circuit 302 may include a twentieth transistor M20. The twentieth transistor M20 has a gate connected to the initialization voltage terminal TRST, a first electrode connected to the low-level terminal VGL, and a second electrode connected to the signal output terminal Output.

Embodiments of the present disclosure also provide a driving method for the aforementioned shift register.

Figure 6:
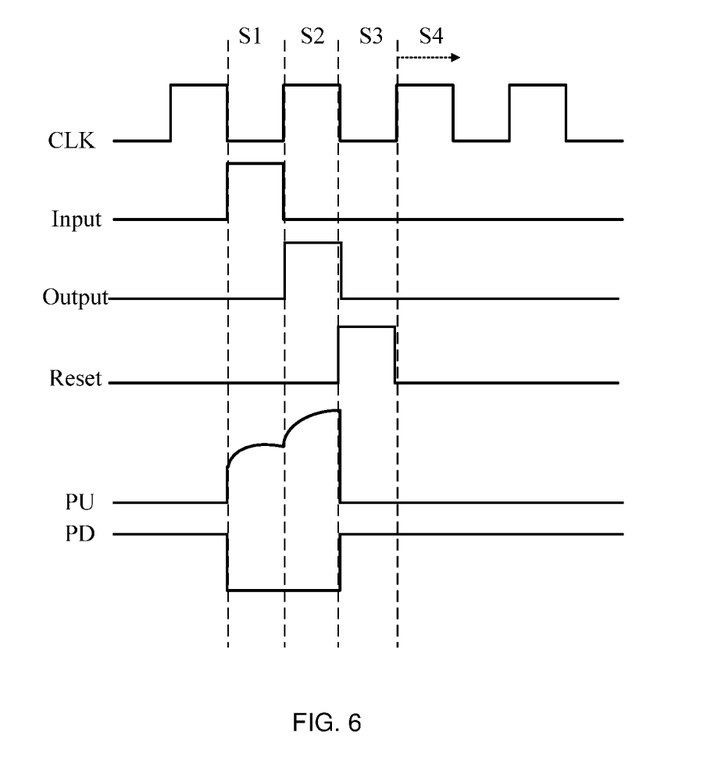
FIG. 6 is a timing control diagram of a shift register according to an embodiment of the present disclosure.

The driving method for the shift register will be further described below taking the shift register of FIG. 5 as an example, with reference to the timing signal of FIG. 6.

Specifically, in one image display frame, the foregoing driving method includes the following stages.

An initialization stage when an image display frame begins (not shown in FIG. 6):

Under the control of the voltage of the initialization voltage terminal TRST, the pull-up initialization sub-circuit 301 and the output initialization sub-circuit 302 are turned on (that is, the nineteenth transistor M19 and the twentieth transistor M20 are turned on), and the low level voltage of the low-level terminal VGL is output to the pull-up node PU and the signal output Output for initialization.

Charging Phase S1:

Under the control of the voltage of the signal input terminal Input, the input sub-circuit 101 is turned on, the voltage of the first power supply terminal VDD is output to the pull-up node PU, and the potential of the pull-up node PU is sustained by the first storage sub-circuit 201. Under the control of the voltage of the pull-up node PU, the output sub-circuit 103 is turned on, and the voltage of the clock signal terminal CKL is output to the signal output terminal Output; and, under the control of the voltage of the signal input terminal Input, the second control sub-circuit 106 is turned on, and the voltage of the low-level terminal VGL is output to the pull-down node PD.

Specifically, under the control of the high level voltage of the signal input terminal Input, the fifth transistor M5 is turned on, the high level voltage of the first power supply terminal VDD is output to the pull-up node PU, and the potential of the pull-up node PU is sustained by the first capacitor C1; the tenth transistor M10 is turned on, and the low level voltage of the low-level terminal VGL is output to the pull-down node PD; under the control of the high level voltage of the pull-up node PU, the seventh transistor M7 is turned on, and the low level voltage of the clock signal terminal CKL is output to signal output terminal Output.

Output Phase S2:

The first storage sub-circuit 201 charges the pull-up node PU, and the output sub-circuit 103 remains turned on under the control of the voltage of the pull-up node PU, and the voltage of the clock signal terminal CKL is output as a scan signal to the signal output terminal Output.

Specifically, the first capacitor C1 charges the pull-up node PU with the high level potential stored during the charging phase S1, and the seventh transistor M7 remains turned on under the control of the high level voltage of the pull-up node PU, and the high level voltage of the clock signal terminal CKL is output as a scan signal to the signal output terminal Output.

Of course, in the output phase S2, the first capacitor C1 will further raise the potential of the pull-up node PU by its own bootstrap effect under the control of a high level voltage output by the signal output terminal Output.

Reset Phase S3:

Under the control of the voltage of the reset signal terminal Reset, the reset sub-circuit 102 is turned on, and the voltage of the second power supply terminal VSS is output to the pull-up node PU for resetting; the first control sub-circuit 105 is turned on, and the voltage of the first power supply terminal VDD is output to the pull-down node PD; under the control of the voltage of the pull-down node PD, the pull-down sub-circuit 104 is turned on, and the voltage of the low-level terminal VGL is output to the signal output terminal Output for resetting.

Specifically, under the control of the high level voltage of the reset signal terminal Reset, the sixth transistor M6 is turned on, and the low level voltage of the second power supply terminal VSS is output to the pull-up node PU for resetting; the ninth transistor M9 is turned on, and the high level voltage of the first power supply terminal VDD is output to the pull-down node PD; under the control of the high level voltage of the pull-down node PD, the eighth transistor M8 is turned on, and the low level voltage of the low-level terminal VGL is output to the signal output terminal Output for resetting.

Before the arrival of the next image frame, i.e., during the noise reduction phase S4, the second capacitor C2 charges the pull-down node PD, the pull-down node PD remains at a high potential, the pull-down sub-circuit 104 remains turned on (i.e., the eighth transistor M8 remains on), and the low level voltage of the low-level terminal VGL is continuously output to the signal output terminal Output for noise reduction.

It can be understood that, regardless of which phase described above the shift register is at, the pull-up sustaining sub-circuit 100 can sustain the potential of the pull-up node PU (including a high potential phase and a low potential phase), and the sustaining sub-circuit 200 can sustain the potential of the pull-down node PD (including a high potential phase and a low potential phase).

Figure 7:
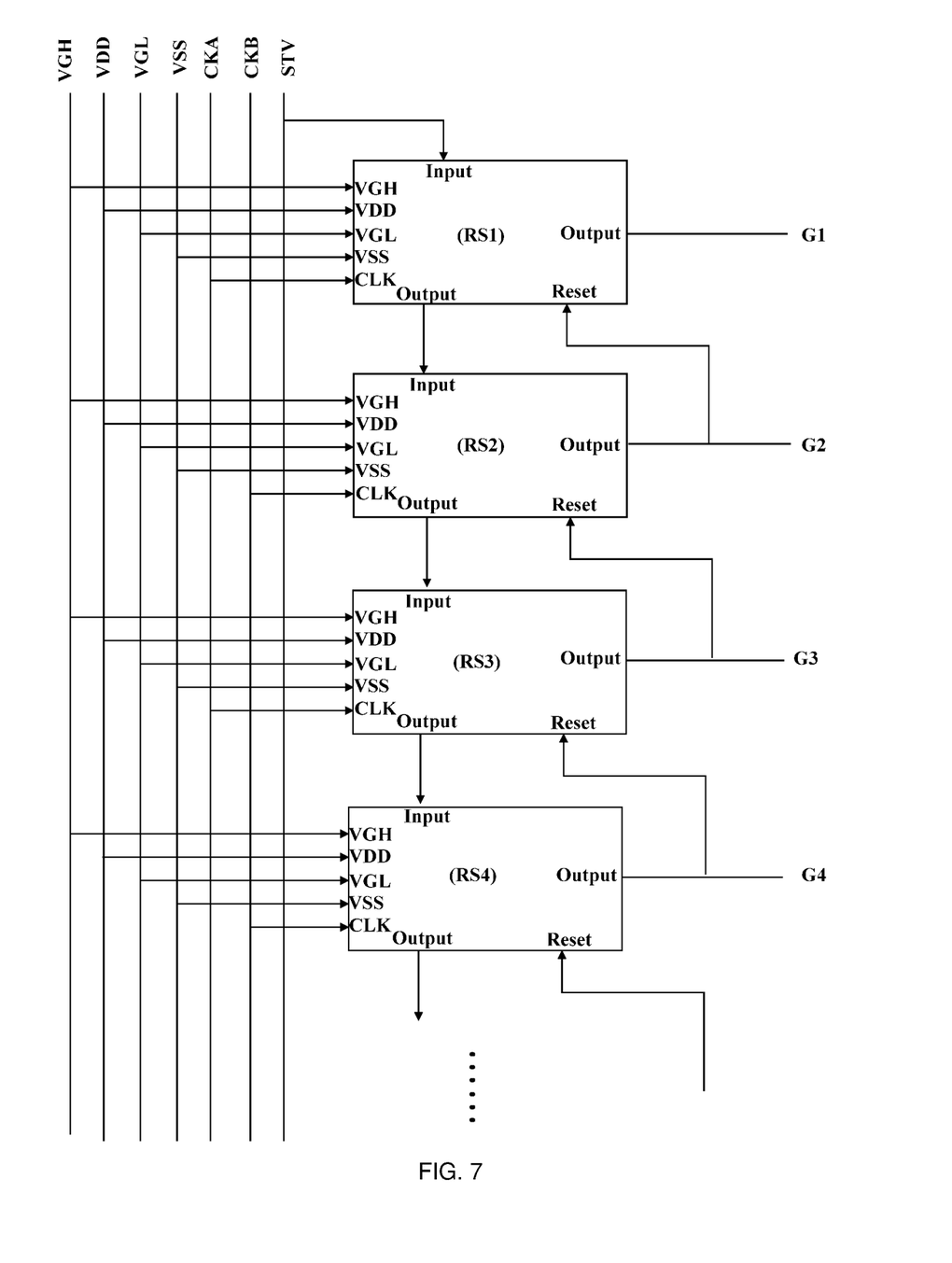
FIG. 7 is a schematic structural diagram of a gate driving circuit according to an embodiment of the present disclosure.

Embodiments of the present disclosure further provide a gate driving circuit. As shown in FIG. 7, the gate driving circuit includes at least two stages of cascaded shift registers as described above, which have the same structure and advantageous effects as the shift registers according to the foregoing embodiment. Since the structure and advantageous effects of the shift register has been described in detail in the foregoing embodiment, it will not be described herein.

Specifically, in the above gate driving circuit, the signal input terminal Input of the first stage shift register RS1 is connected to a start signal terminal STV; a signal input terminal Input of a shift register of any stage other than the first stage is connected to a signal output terminal Output of a shift register of the previous stage; a reset signal terminal Reset of a shift register of any stage other than the last stage is connected to a signal output terminal Output of a shift register of the next stage; a reset signal terminal Reset of the shift register of the last stage is either connected to the start signal terminal STV or set separately.

In addition, regarding the connection of the clock signal terminal CKL of each stage of shift register in the gate driving circuit, in some embodiments, as shown in FIG. 7, a first system clock signal terminal CKA and a second system clock signal terminal CKB may be set for the gate driving circuit in a practical implementation; wherein the clock signals of the first system clock signal terminal CKA and the second system clock signal terminal CKB are a pair of clock signals inverted mutually.

As shown in FIG. 7, the clock signal terminal CKL in an odd-numbered stage of shift register (for example, RS1, RS3, . . . ) is connected to the first system clock signal terminal CKA; and the clock signal terminal CKL in an even-numbered stage of shift register (for example, RS2, RS4 . . . ) is connected to the second system clock signal terminal CKB.

In addition, the present disclosure also provides a display device including the gate driving circuit as described above, which has the same structure and advantageous effects as the shift registers according to the foregoing embodiment. Since the structure and advantageous effects of the shift register has been described in detail in the foregoing embodiment, it will not be described herein.

It should be noted that, in the embodiments of the present disclosure, the display device may specifically include at least a liquid crystal display panel and an organic light emitting diode display panel. The display device may be any product or component having a display function, such as a liquid crystal panel, an electronic paper, an OLED panel, a mobile phone, a tablet computer, a television set, a monitor, a notebook computer, a digital photo frame, a navigator, or the like.

The above description is only a specific embodiment of the present disclosure, but the scope of the present disclosure is not limited thereto, and any person skilled in the art can easily anticipate changes or alternatives within the technical scope disclosed by the present disclosure, which should be covered by the protection scope of the present disclosure. Therefore, the protection scope of the present disclosure should be subject to the protection scope of the claims.

We claim:

1. A shift register comprising:
an input sub-circuit connected to a signal input terminal, a first power supply terminal, and a pull-up node, wherein the input sub-circuit is configured to output a voltage of the first power supply terminal to the pull-up node under the control of a voltage of the signal input terminal;
a reset sub-circuit connected to the pull-up node, a second power supply terminal, and a reset signal terminal, wherein the reset sub-circuit is configured to output a voltage of the second power supply terminal to the pull-up node under the control of a voltage of the reset signal terminal;
an output sub-circuit connected to the pull-up node, a signal output terminal, and a clock signal terminal, wherein the output sub-circuit is configured to output a voltage of the clock signal terminal to the signal output terminal under the control of the voltage of the pull-up node;
a pull-down sub-circuit connected to a pull-down node, a second level terminal, and the signal output terminal, wherein the pull-down sub-circuit is configured to output a second level voltage of the second level terminal to the signal output terminal under the control of a voltage of the pull-down node;
a first control sub-circuit is connected to the reset signal terminal, the first power supply terminal, and the pull-down node, wherein the first control sub-circuit is configured to output the voltage of the first power supply terminal to the pull-down node under the control of the voltage of the reset signal terminal;
a second control sub-circuit is connected to the signal input terminal, the second power supply terminal, and the pull-down node, wherein the second control sub-circuit is configured to output the voltage of the second power supply terminal to the pull-down node under the control of the voltage of the signal input terminal;
a first storage sub-circuit is connected to the pull-up node and the signal output terminal; the first storage sub-circuit is configured to sustain the potential of the pull-up node, wherein the first storage sub-circuit is further configured to charge the pull-up node; and
a first node sustaining circuit connected to a first node, a first level terminal and the second-level terminal, wherein the first node sustaining circuit is configured to sustain the potential of the first node under the control of a first level voltage of the first level terminal and the second level voltage of the second level terminal, wherein the first node is one of the pull-up node or the pull-down node.

2. The shift register according to claim 1, wherein:
the first node sustaining circuit comprises a first sustainment control sub-circuit and a second sustainment control sub-circuit;
the first sustainment control sub-circuit is connected to the first node, the first level terminal, the second level terminal, and the second sustainment control sub-circuit, and configured to output the first level voltage of the first level terminal or the second level voltage of the second level terminal to the second sustainment control sub-circuit under the control of the first node; and
the second sustainment control sub-circuit is connected to the first node, the first level terminal, the second level terminal, and the first sustainment control sub-circuit, and configured to output the first level voltage of the first level terminal or the second level voltage of the second level terminal to the first node under the control of the first sustainment control sub-circuit.

3. The shift register according to claim 2, wherein:
the first sustainment control sub-circuit comprises a first transistor and a second transistor, wherein an aspect ratio of the second transistor is larger than an aspect ratio of the first transistor;
the first transistor has a gate and a first electrode both connected to the first level terminal, and a second electrode connected to the second sustainment control sub-circuit; and
the second transistor has a gate connected to the first node, a first electrode connected to the second sustainment control sub-circuit, and a second electrode connected to the second level terminal.

4. The shift register according to claim 3, wherein:
the second sustainment control sub-circuit comprises a third transistor and a fourth transistor, and wherein an aspect ratio of the fourth transistor is larger than an aspect ratio of the third transistor;
the third transistor has a gate and a first electrode both connected to the first level terminal, and a second electrode connected to the first node; and
the fourth transistor has a gate connected to the first sustainment control sub-circuit, a first electrode connected to the first node, and a second electrode connected to the second level terminal.

5. The shift register according to claim 2, wherein:
the second sustainment control sub-circuit comprises a third transistor and a fourth transistor, and wherein an aspect ratio of the fourth transistor is larger than an aspect ratio of the third transistor;
the third transistor has a gate and a first electrode both connected to the first level terminal, and a second electrode connected to the first node; and
the fourth transistor has a gate connected to the first sustainment control sub-circuit, a first electrode connected to the first node, and a second electrode connected to the second level terminal.

6. The shift register according to claim 1, further comprising:
a second node sustaining circuit connected to a second node, the first level terminal and the second-level terminal, the second node sustaining circuit being configured to sustain the potential of the second node under the control of the first level voltage of the first level terminal and the second level voltage of the second level terminal, wherein the second node is another of the pull-up node or the pull-down node different from the first node.

7. The shift register according to claim 1, wherein:
the second node sustaining circuit comprises a third sustainment control sub-circuit and a fourth sustainment control sub-circuit;
the third sustainment control sub-circuit is connected to the second node, the first level terminal, the second level terminal, and the fourth sustainment control sub-circuit, and configured to output the first level voltage of the first level terminal or the second level voltage of the second level terminal to the fourth sustainment control sub-circuit under the control of the second node; and
the fourth sustainment control sub-circuit is connected to the second node, the first level terminal, the second level terminal, and the third sustainment control sub-circuit, and configured to output the first level voltage of the first level terminal or the second level voltage of the second level terminal to the second node under the control of the third sustainment control sub-circuit.

8. The shift register according to claim 7, wherein:
the third sustainment control sub-circuit comprises an eleventh transistor and a twelfth transistor, and wherein an aspect ratio of the twelfth transistor is larger than an aspect ratio of the eleventh transistor;
the eleventh transistor has a gate and a first electrode both connected to the first level terminal, and a second electrode connected to the fourth sustainment control sub-circuit; and
the twelfth transistor has a gate connected to the second node, a first electrode connected to the fourth sustainment control sub-circuit, and a second electrode connected to the second level terminal.

9. The shift register according to claim 8, wherein:
the fourth sustainment control sub-circuit comprises a thirteenth transistor and a fourteenth transistor, and wherein an aspect ratio of the fourteenth transistor is larger than an aspect ratio of the thirteenth transistor;
the thirteenth transistor has a gate and a first electrode both connected to the first level terminal, and a second electrode connected to the second node; and
the fourteenth transistor has a gate connected to the third sustainment control sub-circuit, a first electrode connected to the second node, and a second electrode connected to the second level terminal.

10. The shift register according to claim 7, wherein:
the fourth sustainment control sub-circuit comprises a thirteenth transistor and a fourteenth transistor, and wherein an aspect ratio of the fourteenth transistor is larger than an aspect ratio of the thirteenth transistor;
the thirteenth transistor has a gate and a first electrode both connected to the first level terminal, and a second electrode connected to the second node; and
the fourteenth transistor has a gate connected to the third sustainment control sub-circuit, a first electrode connected to the second node, and a second electrode connected to the second level terminal.

11. The shift register according to claim 1, further comprising:
a second storage sub-circuit connected to the pull-down node and the second level terminal,
wherein the second storage sub-circuit is configured to sustain the potential of the pull-down node, and is further configured to charge the pull-down node.

12. The shift register according to claim 11, wherein:
the second storage sub-circuit comprises a second capacitor, the second capacitor having a first terminal connected to the pull-down node, and a second terminal connected to the second level terminal.

13. The shift register according to claim 1, further comprising at least one of:
a pull-up initialization sub-circuit connected to the pull-up node, the second level terminal, and an initialization voltage terminal, and configured to output the second level voltage of the second level terminal to the pull-up node under the control of a voltage of the initialization voltage terminal; or
an output initialization sub-circuit connected to the signal output terminal, the second level terminal, and the initialization voltage terminal, and configured to output the second level voltage of the second level terminal to the signal output terminal under the control of the voltage of the initialization voltage terminal.

14. The shift register according to claim 13, wherein:
the pull-up initialization sub-circuit comprises a nineteenth transistor, the nineteenth transistor having a gate connected to the initialization voltage terminal, a first electrode connected to the second level terminal, and a second electrode connected to the pull-up node; and
the output initialization sub-circuit comprises a twentieth transistor, the twentieth transistor having a gate connected to the initialization voltage terminal, a first electrode connected to the second level terminal, and a second electrode connected to the signal output terminal.

15. The shift register according to claim 1, wherein:
the input sub-circuit comprises a fifth transistor, the fifth transistor having a gate connected to the signal input terminal, a first electrode connected to the first power supply terminal, and a second electrode connected to the pull-up node;
the reset sub-circuit comprises a sixth transistor, the sixth transistor having a gate connected to the reset signal terminal, a first electrode connected to the second power supply terminal, and a second electrode connected to the pull-up node;
the output sub-circuit comprises a seventh transistor, the seventh transistor having a gate connected to the pull-up node, a first electrode connected to the clock signal terminal, and a second electrode connected to the signal output terminal;
the pull-down sub-circuit comprises an eighth transistor, the eighth transistor having a gate connected to the pull-down node, a first electrode connected to the second level terminal, and a second electrode connected to the signal output terminal;
the first control sub-circuit comprises a ninth transistor, the ninth transistor having a gate connected to the reset signal terminal, a first electrode connected to the first power supply terminal, and a second electrode connected to the pull-down node;
the second control sub-circuit comprises a tenth transistor, the tenth transistor having a gate connected to the signal input terminal, a first electrode connected to the second power supply terminal, and a second electrode connected to the pull-down node; and
the first storage sub-circuit comprises a first capacitor, the first capacitor having a first terminal connected to the pull-up node, and a second terminal connected to the signal output terminal.

16. A gate driving circuit comprising at least two stages of cascaded shift registers according to claim 1, wherein:
a signal input terminal of the shift register of the first stage is connected to a start signal terminal;
a signal input terminal of a shift register of any stage other than the first stage is connected to a signal output terminal of a shift register in a previous stage;
a reset signal terminal of a shift register of any stage other than the last stage is connected to a signal output terminal of a shift register of a next stage, and
a reset signal terminal of a shift register of the last stage is either connected to the start signal terminal or set separately.

17. A display device comprising the gate driving circuit of claim 16.

* * * * *